USOO7142054B2

(12) United States Patent
Goree

(10) Patent No.: US 7,142,054 B2
(45) Date of Patent: Nov. 28, 2006

(54) AMPLIFYING SIGNALS USING A QUADRATURE COUPLED AMPLIFIER

(75) Inventor: Leven H. Goree, Redington Shores, FL (US)

(73) Assignee: Raytheon Company, Waltham, MA (US)

( * ) Notice: Subject to any disclaimer, the term of this patent is extended or adjusted under 35 U.S.C. 154(b) by 64 days.

(21) Appl. No.: 10/840,457

(22) Filed: May 6, 2004

(65) Prior Publication Data

US 2005/0248403 A1    Nov. 10, 2005

(51) Int. Cl.
 *H03F 1/00*    (2006.01)
(52) U.S. Cl. ...................................... 330/151; 330/149
(58) Field of Classification Search ................ 330/149, 330/151, 52
 See application file for complete search history.

(56) References Cited

U.S. PATENT DOCUMENTS

| 1,686,792 | A |   | 10/1928 | Black |  |
|---|---|---|---|---|---|
| 4,352,072 | A | * | 9/1982 | Harrington | 330/151 |
| 4,490,683 | A |   | 12/1984 | Rhee | 330/51 |
| 5,644,268 | A | * | 7/1997 | Hang | 330/151 |
| 6,266,517 | B1 | * | 7/2001 | Fitzpatrick et al. | 455/114.3 |
| 6,583,739 | B1 |   | 6/2003 | Kenington | 341/118 |
| 2003/0181191 | A1 |   | 9/2003 | Gentzler | 455/334 |

FOREIGN PATENT DOCUMENTS

GB    2 107 540 A    4/1983

OTHER PUBLICATIONS

Seidel, H., et al., "Error-Controlled High Power Linear Amplifiers at VHF", The Bell System Technical Journal, vol. 47, May-Jun. 1968, No. 5, © 1968, American Telephone and Telegraph Company, pp. 651-772.
Pratt, William H., "A Direct Quadrature Modulator IC For 0.9 to 2.5 GHZ Wireless Systems", Technical Article, RF Micro Devices, Inc., originally presented in RF Design, Aug. 1994, 5 pages.
Sundström, Lars, "Digital RF Power Amplifier Linearisers Analysis and Design", Department of Applied Electronics, Lund University, Sweden, CODEN;LUTEDX/(TETE-1013)/1-150 (1995), 74 pages.
Woo, et al., "Feedforward Amplifier for WCDMA Base Stations with a New Adaptive Control Method", WE2A-2, Department of Electronic and Electrical Engineering and Microwave Application Research Center, Pohang University of Science and Technology (POSTECH), IEEE MTT-S CDROM, pp. 769-772, 2002.
Kenington, P.B., "Emerging technologies for software radio," XP-000903140, Electronics & Communications Engineering Journal, vol. 11, No. 2, pp. 69-83, Apr. 1999.
PCT, Notification of Transmittal of the International Search Report and The Written Opinion of the International Searching Authority, or the Declaration, dated Sep. 30, 2005 for International Application No. PCT/US2005/015944, 14 pages.

* cited by examiner

*Primary Examiner*—Khanh Van Nguyen
(74) *Attorney, Agent, or Firm*—Baker Botts L.L.P.

(57) ABSTRACT

Amplifying signals includes receiving an input signal. The input signal is amplified at a quadrature coupled amplifier to generate an amplified signal. The input signal is compared with the amplified signal to generate an error signal. The error signal is amplified at the quadrature coupled amplifier to generate an amplified error signal. The amplified error signal is compared with the amplified signal to generate an output signal.

16 Claims, 1 Drawing Sheet

US 7,142,054 B2

AMPLIFYING SIGNALS USING A QUADRATURE COUPLED AMPLIFIER

TECHNICAL FIELD

This invention relates generally to the field of power amplifiers and more specifically to amplifying signals using a quadrature coupled amplifier.

BACKGROUND

Feedforward amplifiers may be used in communication systems to amplify signals while reducing non-linearity effects. In known feedforward amplifiers, an input signal is amplified by a power amplifier to yield a high power output signal. The amplified signal is compared with the input signal to generate an error signal. The error signal may be amplified to compensate for combining losses. The error signal is combined with the high power output signal in order to reduce the non-linearity effect of the power amplifier. Known feedforward amplifiers, however, are typically inefficient. It is generally desirable to have efficient feedforward amplifiers.

SUMMARY OF THE DISCLOSURE

In accordance with the present invention, disadvantages and problems associated with previous techniques for amplifying signals may be reduced or eliminated.

According to one embodiment of the present invention, a system for amplifying an input signal includes an input that receives the input signal. A quadrature coupled amplifier amplifies the input signal to generate an amplified signal. An error signal generator compares the input signal with the amplified signal to generate an error signal. The quadrature coupled amplifier amplifies the error signal to generate an amplified error signal. A coupler combines the amplified error signal with the amplified signal to generate an output signal.

According to one embodiment of the present invention, a method for amplifying signals includes receiving an input signal. The input signal is amplified at a quadrature coupled amplifier to generate an amplified signal. The input signal is compared with the amplified signal to generate an error signal. The error signal is amplified at the quadrature coupled amplifier to generate an amplified error signal. The amplified error signal is compared with the amplified signal to generate an output signal.

Certain embodiments of the invention may provide one or more technical advantages. A technical advantage of one embodiment may be that an input signal and an error signal of a feedforward amplifier may be amplified by a quadrature coupled amplifier. Amplifying the error signal using the quadrature coupled amplifier instead of a separate high power amplifier may reduce the power requirements of the feedforward amplifier.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
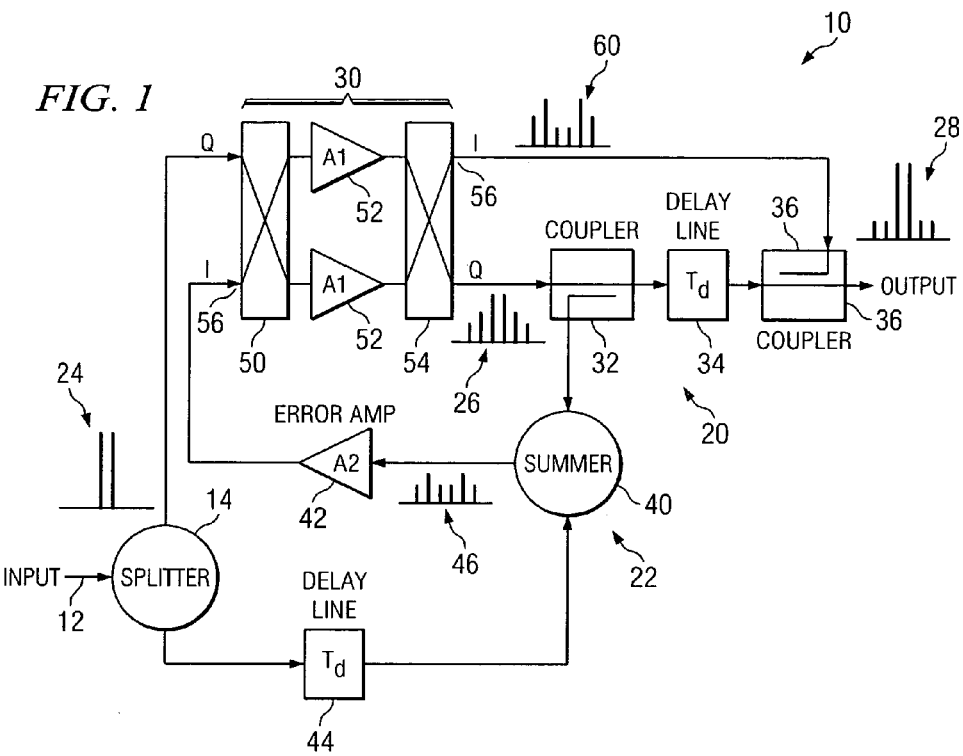
FIG. 1 is a block diagram of one embodiment of a system for amplifying signals that may be used in accordance with the present invention.
Figure 2:
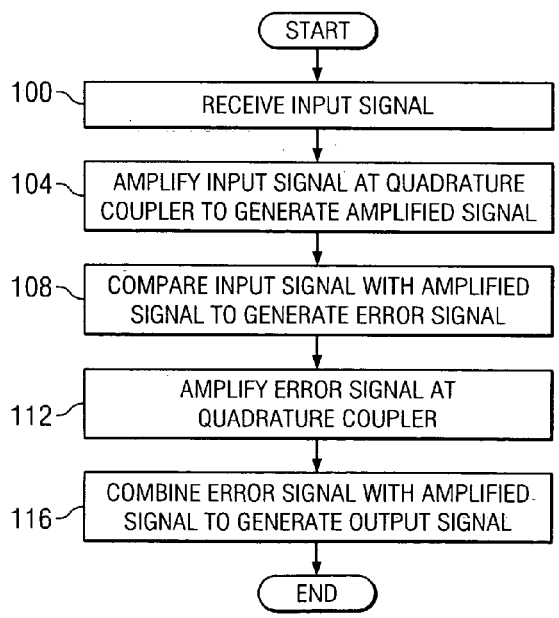
FIG. 2 is a flowchart demonstrating one embodiment of a method for amplifying signals that may be used in accordance with the present invention.

Embodiments of the present invention and its advantages are best understood by referring to FIGS. 1 and 2 of the drawings, like numerals being used for like and corresponding parts of the various drawings.

FIG. 1 is a block diagram illustrating one embodiment of a feedforward amplifier system 10 for amplifying signals. In general, system 10 includes a quadrature coupled amplifier that amplifies an input signal to yield an amplified signal. The amplified signal is compared with a time delayed input signal to generate an error signal. The error signal is amplified by the quadrature coupled amplifier and combined with a time delayed amplified signal to reduce non-linearity effects in an output signal.

According to the illustrated embodiment, system 10 includes an input 12 and a splitter 14 coupled to an on-line portion 20 and an off-line portion 22 as shown. On-line portion 20 includes components that amplify input signal 24 to yield an amplified signal 26, and combine amplified signal 26 with an amplified error signal 60 to yield an output signal 28. Off-line portion 22 includes components that generate an error signal 46 from input signal 24 and amplified signal 26. According to the illustrated embodiment, on-line portion 20 includes a quadrature coupled amplifier 30, a coupler 32, a delay line 34, and a coupler 36 coupled as shown. Off-line portion 22 includes an error signal generator such as a summer 40, an error amplifier 42, and a delay line 44 coupled as shown.

Input 12 receives an input signal 24. "Signal" may refer to an electrical quantity, such as a current or voltage, that may be used to convey information for communication, control, calculation, or other suitable purpose. Input signal 24 may comprise any suitable signal, for example, a broadband multi-carrier signal. Input signal 24 may have two tones and twenty to twenty-five decibels referred to one milliwatt (dBm) such as approximately twenty-three dBm. Splitter 14 splits input signal 24 into a first input signal 24 and a second input signal 24. First input signal 24 is directed to on-line portion 20, and second input signal 24 is directed to off-line portion 22. Splitter 14 may comprise any suitable splitter operable to split a signal, for example, a three dB splitter.

Quadrature coupled amplifier 30 amplifies input signal 24 to yield amplified signal 26, and amplifies error signal 46 to yield amplified error signal 60. Quadrature coupled amplifier 30 may comprise a 90° quadrature splitter, two or more parallel amplifiers, and a 90° quadrature combiner. The channel gain of quadrature coupled amplifier 30 may be approximately twenty to twenty-five dB such as approximately twenty-four dB. Quadrature coupled amplifier 30 may include isolation ports 56 through which a signal such as input signal 24 or error signal 46 may be input to and output from quadrature coupled amplifier 30.

According to the illustrated embodiment, quadrature coupled amplifier 30 includes a quadrature splitter 50, amplifiers 52, and a quadrature combiner 54. Quadrature splitter 50 splits a signal into two components at the same frequency but with a fixed phase of 90 degrees. Quadrature coupled amplifier 30 amplifies the signal components as I and Q input signals to produce I and Q signal output signals. Amplifiers 52 may include any suitable amplifier operable to amplify a signal. The total power P of amplifiers 52 may be selected as appropriate to amplify input signal 24. For example, the total power P may be 16 to 24 watts (W) such as approximately 20 W. The power of each amplifier 52 of a number n amplifiers 52 may be P/n. For example, the power of each of two amplifiers 52 may be approximately 8 to 12 W such as approximately 10 W for total power P of 16 to 24 W such as approximately 20 W. Quadrature combiner 54 combines the components of a signal, and may comprise a three dB stripline 90° coupler.

Coupler 32 splits amplified signal 26 into a first amplified signal 26 and a second amplified signal 26. Coupler 32 may comprise a stripline directional coupler. First amplified signal 26 is sent to delay line 34, and second amplified signal 26 is attenuated by the coupler and sent to summer 40. Delay line 44 delays input signal 24 such that a sample of delayed input signal 24 reaches summer 40 at substantially the same time that a corresponding sample of amplified signal 26 reaches summer 40. Delay line 44 may comprise a passive circuit.

Summer 40 generates an error signal 46 from input signal 24 and amplified signal 26. Error signal 26 represents the non-linearity of quadrature coupled amplifier 30, and may indicate the difference between input signal 24 and amplified signal 26. Error signal 46 is used to compensate for the non-linearity of amplifiers 52 to reduce non-linearity effects in output signal 28 resulting from the non-linearity. Summer 40 may comprise a 180° summer that operates to determine the difference between input signal 24 and amplified signal 26.

Error amplifier 42 amplifies error signal 46. By using quadrature coupled amplifier 30 to amplify error signal 46, error amplifier 42 is not required to be a high power amplifier. Error amplifier 42 may comprise a low power amplifier such as a less than two watt or less than one watt amplifier such as an approximately one-tenth of one watt amplifier. Error amplifier 42 may apply a gain of ten to fifteen dB such as approximately thirteen dB. As described above, error signal 46 is amplified by quadrature coupled amplifier 30 to yield amplified error signal 60.

Delay line 34 delays amplified signal 26 such that the delayed amplified signal 26 reaches coupler 36 substantially when amplified error signal 60 reaches coupler 36. Coupler 36 combines error signal 60 with amplified signal 26 to generate output signal 28. Combining error signal 60 with amplified signal 26 may compensate for the non-linearity of amplifiers 52, which may reduce non-linearity effects in output signal 28. Error signal 60 may result in greater than thirty dB carrier cancellation.

According to one embodiment, in operation system 10 for amplifying input signal 24 includes input 12 that receives input signal 24. Quadrature coupled amplifier 30 amplifies input signal 24 to generate a high power amplified signal 26. A combiner or summer 40 combines a time delayed sample of input signal 24 to an out-of-phase sample of the quadrature amplified high power signal 26 to generate error signal 46 comprising a time synchronized signal. Error signal 46 may be amplified by a low power, low gain, linear amplifier 42 to compensate for system loss. Error signal 46 is amplified to a high level through the quadrature path of quadrature coupled amplifier 30. Input signal 24 and error signal 46 are separated due to their phase characteristics by the output combiner 54 of quadrature coupled amplifier 30. Error signal 46 is amplified by quadrature coupled amplifier 30 to yield error signal 60 amplified to a high level. The high level error signal 60 is combined with a time delayed high power signal 26 to reduce or cancel non-linear components and produce output signal 28, which may have improved linearity.

System 10 may be used in any suitable application in which signals are amplified such as in a radio frequency transmitter. For example, system 10 may be used in a transmitter at a base station of a multi-carrier communications system. As another example, system 10 may be used in mobile, airborne, or spacecraft applications to amplify broadband multi-carrier signals.

Modifications, additions, or omissions may be made to system 10 without departing from the scope of the invention. Moreover, the operations of system 10 may be performed by more, fewer, or other modules. For example, the operations of coupler 32 and delay line 34 may be performed by one module, or the operations of summer 40 may be performed by more than one module. Additionally, operations of system 10 may be performed using any suitable logic comprising software, hardware, other logic, or any suitable combination of the preceding. As used in this document, "each" refers to each member of a set or each member of a subset of a set.

FIG. 2 is a flowchart illustrating one embodiment of a method for amplifying signals that may be used with system 10 of FIG. 1. The method, however, may be used with any suitable system operable to amplify a signal. The method begins at step 100, where input signal 24 is received. For example, input 12 receives input signal 24.

Input signal 24 is amplified at step 104 to generate amplified signal 26. For example, quadrature coupled amplifier 30 amplifies input signal 24 to generate amplified signal 26. Input signal 24 is compared with amplified signal 26 at step 108 to generate error signal 46. For example, summer 40 compares delayed input signal 24 received from delay line 40 with amplified signal 26 received from coupler 32 to generate error signal 46.

Error signal 46 is amplified at quadrature coupled amplifier 30 at step 112. Error signal 46 may be amplified by a low powered power amplifier 42 placed after summer 40, or input signal 24 may be amplified prior to summer 40. Amplified error signal 60 is combined with amplified signal 26 at step 116 to generate output signal 28. For example, coupler 36 combines amplified error signal 60 received from quadrature coupled amplifier 30 with delayed amplified signal 26 received from delay line 34 to generate output signal 28. Combining error signal 60 with amplified signal 26 may compensate for the non-linearity of amplifiers 52, which may reduce non-linearity effects in output signal 28. After generating output signal 28, the method terminates.

Modifications, additions, or omissions may be made to the method without departing from the scope of the invention. The method may include more, fewer, or other steps. Additionally, steps may be performed in any suitable order without departing from the scope of the invention.

Certain embodiments of the invention may provide one or more technical advantages. A technical advantage of one embodiment may be that an input signal and an error signal of a feedforward amplifier may be amplified by a quadrature coupled amplifier. Amplifying the error signal using the quadrature coupled amplifier instead of a separate high power amplifier may reduce the power requirements of the feedforward amplifier.

While this disclosure has been described in terms of certain embodiments and generally associated methods,

What is claimed is:

1. A method for amplifying an input signal, comprising:
receiving an input signal;
amplifying the input signal at a quadrature coupled amplifier to generate an amplified signal;
comparing the input signal with the amplified signal to generate an error signal;
amplifying the error signal at a low power amplifier having a power of less than two watts;
amplifying the error signal at the quadrature coupled amplifier to generate an amplified error signal; and
combining the amplified error signal with the amplified signal to generate an output signal.

2. The method of claim 1, wherein the quadrature coupled amplifier further comprises at least one ninety degree quadrature coupled amplifier.

3. The method of claim 1, wherein amplifying the error signal at the quadrature coupled amplifier to generate the amplified error signal further comprises:
receiving the input signal and the error signal at a quadrature splitter;
amplifying the input signal and the error signal at a plurality of amplifiers; and
separately outputting the amplified signal and the amplified error signal from a quadrature combiner.

4. The method of claim 1, wherein amplifying the error signal at the quadrature coupled amplifier to generate the amplified error signal further comprises:
receiving the error signal at an input isolation port of the quadrature coupled amplifier; and
outputting the amplified error signal at an output isolation port of the quadrature coupled amplifier.

5. The method of claim 1, further comprising splitting the input signal into a first input signal and a second input signal, the first input signal being amplified to generate the amplified signal, the second input signal being combined with the amplified signal to generate the error signal.

6. A system for amplifying an input signal, comprising:
an input operable to receive an input signal;
a quadrature coupled amplifier coupled to the input and operable to amplifier the input signal to generate an amplified signal;
an error signal generator coupled to the quadrature coupled amplifier and operable to compare the input signal with the amplified signal to generate an error signal;
a low power amplifier coupled to the quadrature coupled amplifier and operable to amplify the error signal, the low power amplifier having a power of less than two watts;
the quadrature coupled amplifier further operable to amplify the error signal to generate an amplified error signal; and
a coupler coupled to the error signal generator and operable to combine the amplified error signal with the amplified signal to generate an output signal.

7. The system of claim 6, the quadrature coupled amplifier further comprising at least one ninety degree quadrature coupled amplifier.

8. The system of claim 6, the quadrature coupled amplifier further comprising:
a quadrature splitter operable to receive the input signal and the error signal;
a plurality of amplifiers operable to amplify the input signal and the error signal; and
a quadrature combiner operable to separately output the amplified signal and the amplified error signal.

9. The system of claim 6, the quadrature coupled amplifier further comprising:
an input isolation port operable to receive the error signal; and
an output isolation port operable to output the amplified error signal.

10. The system of claim 6, further comprising a splitter operable to split the input signal into a first input signal and a second input signal, the first input signal being amplified to generate the amplified signal, the second input signal being combined with the amplified signal to generate the error signal.

11. A system for amplifying an input signal, comprising:
an input operable to receive an input signal;
a quadrature coupled amplifier coupled to the input and operable to amplify the input signal to generate an amplified signal;
an error signal generator coupled to the quadrature coupled amplifier and operable to compare the input signal with the amplified signal to generate an error signal;
the quadrature coupled amplifier further operable to amplify the error signal to generate an amplified error signal, the quadrature coupled amplifier further comprising:
a quadrature splitter operable to receive the input signal and the error signal;
a plurality of amplifiers operable to amplify the input signal and the error signal; and
a quadrature combiner operable to separately output the amplified signal and the amplified error signal;
a low power amplifier coupled to the quadrature coupled amplifier and operable to amplify the error signal, the low power amplifier having a power of less than two watts; and
a coupler coupled to the error signal generator and operable to combine the amplified error signal with the amplified signal to generate an output signal.

12. The system of claim 11, the quadrature coupled amplifier further comprising a ninety degree quadrature coupled amplifier.

13. The system of claim 11, the quadrature coupled amplifier further comprising:
an input isolation port operable to receive the error signal; and
an output isolation port operable to output the amplified error signal.

14. The system of claim 11, further comprising a splitter operable to split the input signal into a first input signal and a second input signal, the first input signal being amplified to generate the amplified signal, the second input signal being combined with the amplified signal to generate the error signal.

15. A system for amplifying an input signal, comprising:
means for receiving an input signal;
means for amplifying the input signal at a quadrature coupled amplifier to generate an amplified signal;
means for comparing the input signal with the amplified signal to generate an error signal;

means for amplifying the error signal at a low power amplifier having a power of less than two watts;

means for amplifying the error signal at the quadrature coupled amplifier to generate an amplified error signal; and means for combining the amplified error signal with the amplified signal to generate an output signal.

16. A system for amplifying an input signal, comprising:

an input operable to receive an input signal;

a quadrature coupled amplifier coupled to the input and operable to amplify the input signal to generate an amplified signal, the quadrature coupled amplifier further comprising a ninety degree quadrature coupled amplifier;

an error signal generator coupled to the quadrature coupled amplifier and operable to compare the input signal with the amplified signal to generate an error signal;

a low power amplifier coupled to the quadrature coupled amplifier and operable to amplify the error signal, the low power amplifier having a power of less than two watts;

the quadrature coupled amplifier further operable to amplify the error signal to generate an amplified error signal, the quadrature coupled amplifier further comprising:

a quadrature splitter operable to receive the input signal and the error signal;

a plurality of amplifiers operable to amplify the input signal and the error signal; and a quadrature combiner operable to output the amplified signal and the amplified error signal, the quadrature coupled amplifier further comprising:

an input isolation port operable to receive the error signal; and an output isolation port operable to output the amplified error signal; and a coupler coupled to the error signal generator and operable to combine the amplified error signal with the amplified signal to generate an output signal.

* * * * *